US010867154B2

(12) United States Patent
Lee et al.

(10) Patent No.: US 10,867,154 B2
(45) Date of Patent: Dec. 15, 2020

(54) DISPLAY DEVICE INCLUDING FIRST AND SECOND SPACERS

(71) Applicant: LG ELECTRONICS INC., Seoul (KR)

(72) Inventors: Dongeun Lee, Seoul (KR); Jungwhan Kim, Seoul (KR); Jeongmo Koo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 64 days.

(21) Appl. No.: 16/181,184

(22) Filed: Nov. 5, 2018

(65) Prior Publication Data

US 2019/0147214 A1   May 16, 2019

Related U.S. Application Data

(60) Provisional application No. 62/584,113, filed on Nov. 10, 2017.

(30) Foreign Application Priority Data

Mar. 9, 2018   (KR) ........................ 10-2018-0028111

(51) Int. Cl.
*G06K 9/00*   (2006.01)
*G06K 9/20*   (2006.01)
(Continued)

(52) U.S. Cl.
CPC ......... *G06K 9/0004* (2013.01); *G06K 9/0008* (2013.01); *G06K 9/00087* (2013.01);
(Continued)

(58) Field of Classification Search
CPC ..... G06K 9/0004; G06K 9/0008; G06K 9/209
See application file for complete search history.

(56) References Cited

U.S. PATENT DOCUMENTS

2009/0236981 A1\* 9/2009 Chang ................. H01L 51/5253
                                                              313/504
2012/0105614 A1   5/2012 Wu et al.
(Continued)

FOREIGN PATENT DOCUMENTS

| CN | 106847872 | 6/2017 |
| WO | 2017058473 | 4/2017 |
| WO | 2017129126 | 8/2017 |

OTHER PUBLICATIONS

European Patent Office Application Serial No. 18196461.0, Search Report dated Mar. 27, 2019, 8 pages.

(Continued)

*Primary Examiner* — Xuemei Zheng
(74) *Attorney, Agent, or Firm* — Lee, Hong, Degerman, Kang & Waimey

(57) ABSTRACT

Disclosed herein is a display device including a display unit, a cover glass protecting the display unit, an optical layer disposed on a back surface of the display unit to form a first air gap, an optical sensor disposed on a back surface of the optical layer to form a second air gap, the optical sensor being mounted on the base substrate, a first spacer positioned between the optical layer and the display unit and arranged around the first air gap, a first sealant applied in a paste state and changed into a hard state to bond the first spacer and the display unit, a second spacer positioned between the optical sensor and the optical layer and arranged around the second air gap, and a controller configured to determine whether information collected by the optical sensor matches the fingerprint information about the user stored in a memory unit.

11 Claims, 7 Drawing Sheets

(51) Int. Cl.
*H01L 27/32* (2006.01)
*H01L 51/52* (2006.01)
*H01L 51/00* (2006.01)

(52) U.S. Cl.
CPC .......... *G06K 9/209* (2013.01); *H01L 27/3227* (2013.01); *H01L 51/0097* (2013.01); *H01L 51/5246* (2013.01); *H01L 51/5275* (2013.01); *G06K 2009/0006* (2013.01); *H01L 2251/5338* (2013.01)

(56) References Cited

U.S. PATENT DOCUMENTS

| | | |
|---|---|---|
| 2017/0220844 A1 | 8/2017 | Jones et al. |
| 2017/0270342 A1 | 9/2017 | He et al. |
| 2017/0300736 A1 | 10/2017 | Song et al. |
| 2017/0308731 A1 | 10/2017 | Evans, V et al. |
| 2017/0323144 A1 | 11/2017 | Wu et al. |

OTHER PUBLICATIONS

PCT International Application No. PCT/KR2018/010360, Notification of Transmittal of the International Search Report and the Written Opinion of the International Searching Authority, or Declaration dated Dec. 27, 2018, 13 pages.

\* cited by examiner (a)

(b)

(a)

(b)

(a)

(b)

DISPLAY DEVICE INCLUDING FIRST AND SECOND SPACERS

Pursuant to 35 U.S.C. § 119, this application claims the benefit of U.S. Provisional Application No. 62/584,113, filed on Nov. 10, 2017 and also claims the benefit of earlier filing date and right of priority to Korean Patent Application No. 10-2018-0028111, filed on Mar. 9, 2018, the contents of which are hereby incorporated by reference herein in their entirety.

BACKGROUND OF THE INVENTION

Field of the Invention

The present invention relates to a display device having a fingerprint recognition sensor mounted on a display unit.

Discussion of the Related Art

With popularization of electronic devices, the importance of user authentication technology for personal security has increased, and biometric-based user authentication technology evolving from the simple technique of setting a password such as a secret code number or a pattern has become common.

In particular, fingerprint sensing technology employs fingerprint recognition as the most basic biometric or authentication process not only for opening and closing a door or accessing a server but also for smart electronic devices such as a smartphone. Fingerprint recognition devices used in small electronic devices such as smartphones are required to be compact in size and the recognition rate thereof is also important. For this reason, related research is being actively conducted.

Conventionally, a fingerprint of a user has been recognized by employing a button or a separate fingerprint recognition unit. However, in recent years, the size of the display unit has become larger and the buttons other than the display unit at the front part have been minimized Thus, it is difficult to secure a space for positioning the fingerprint recognition unit at the front part.

According to this trend, there is a need for a display device that implements a fingerprint recognition function by utilizing the display unit.

SUMMARY OF THE INVENTION

Accordingly, the present invention is directed to a display device that substantially obviates one or more problems due to limitations and disadvantages of the related art.

An object of the present disclosure is to provide a display device in which a fingerprint recognition sensor having a good recognition rate is mounted on a display unit.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a display unit, a cover glass configured to protect a front surface of the display unit, an optical layer disposed on a back surface of the display unit to form a first air gap, an optical sensor disposed on a back surface of the optical layer to form a second air gap, a base substrate, the optical sensor being mounted on the base substrate, a first spacer positioned between the optical layer and the display unit and arranged around the first air gap, a first sealant applied in a paste state and changed into a hard state to bond the first spacer and the display unit, a second spacer positioned between the optical sensor and the optical layer and arranged around the second air gap, a memory unit configured to store fingerprint information about a user, a controller configured to determine whether information collected by the optical sensor matches the fingerprint information about the user stored in the memory unit, and a flexible substrate connecting the controller and the base substrate.

The display device may further include a third spacer positioned between an outer periphery of the base substrate and the back surface of the display unit.

The display device may further include a second sealant applied in the paste state and changed into the hard state to bond the third spacer, the base substrate and the display unit.

The first sealant and the second sealant may be subjected to plastic working in a liquid state or the paste state and changed into a solid state.

The display device may further include a housing, the display unit being mounted on a front surface of the housing, a middle frame positioned inside the housing and configured to support a back surface of the flexible substrate, and an adhesive tape interposed between the flexible substrate and the middle frame.

The display device may further include a housing, the display unit being mounted on a front surface of the housing, a middle frame positioned inside the housing and configured to support a back surface of the flexible substrate, and an adhesive tape interposed between the flexible substrate and the middle frame.

The first spacer may include a hard material.

The optical layer may include a plurality of microlenses.

A pitch between the plurality of microlenses may be equal to or 1/n times a pitch between pixels of the optical sensor.

Thicknesses of the first air gap and the second air gap may be greater than or equal to 20 μm (micrometers) and less than or equal to 30 μm.

The display device may further include a protective layer positioned on the back surface of the display unit, the protective layer including an opening corresponding to an area corresponding to the optical layer and the first sealant.

The display device may further include a metal layer provided on a back surface of the protective layer, the metal layer including a second opening corresponding to the first opening.

The display unit may include a transparent polymer layer, an organic light emitting diode (OLED) positioned on a back surface of the transparent polymer layer, and an electrode layer positioned on a back surface of the OLED.

According to at least one embodiment of the present disclosure, the issue of the depression effect may be prevented when the fingerprint sensor is mounted on the display unit.

In addition, performance deterioration of the fingerprint recognition sensor may be prevented by preventing distortion of the air gap when the user presses the display unit using a finger.

In addition, the Moiré effect caused by mismatch between the pitch of the microlenses and the pitch of the pixels of the optical sensor may be prevented.

It is to be understood that both the foregoing general description and the following detailed description of the present invention are exemplary and explanatory and are intended to provide further explanation of the invention as claimed.

BRIEF DESCRIPTION OF THE DRAWINGS

The present invention will become more fully understood from the detailed description given herein below and the accompanying drawings, which are given by way of illustration only, and thus are not limitative of the present invention, and wherein.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1A:
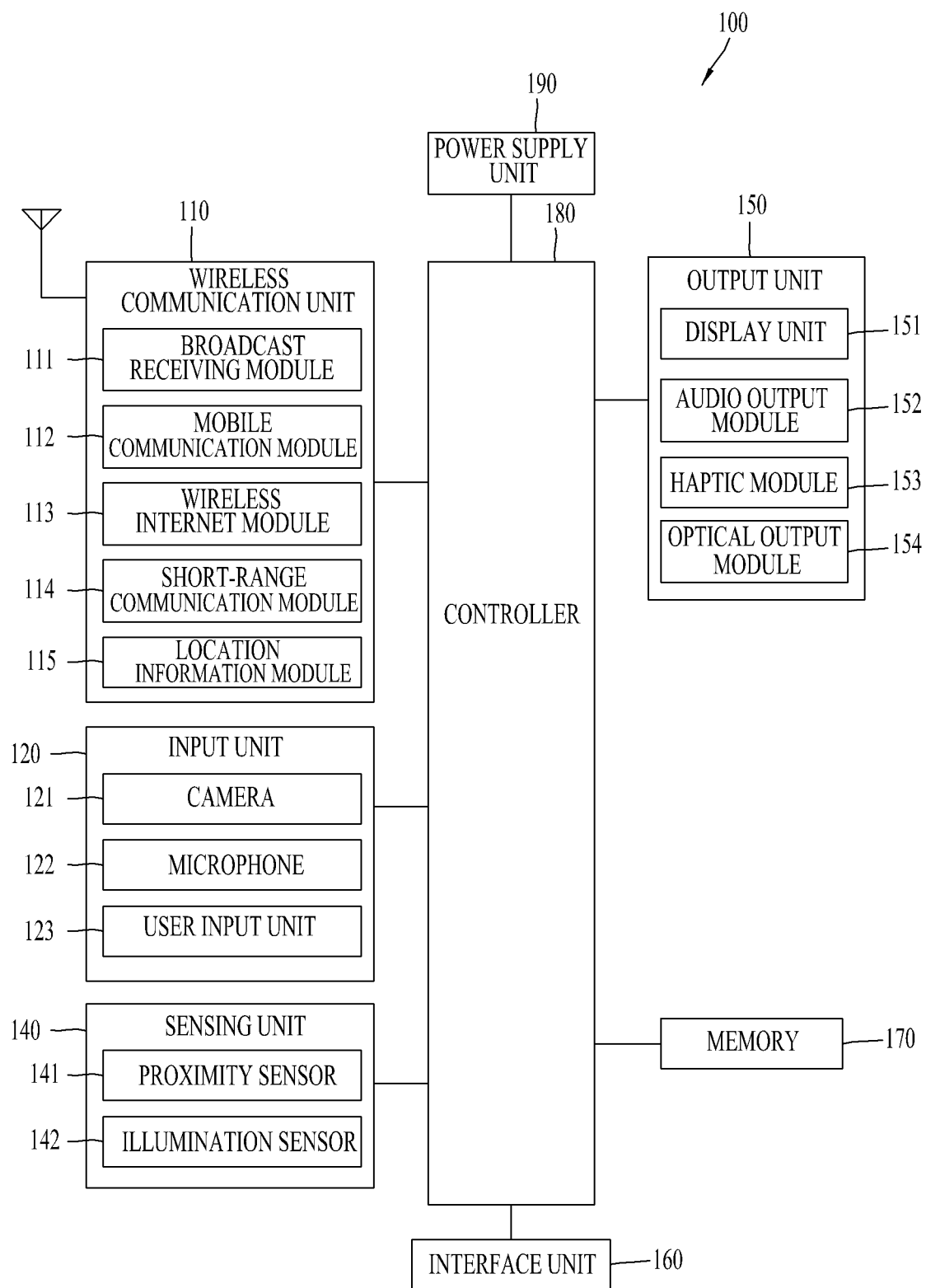
FIG. 1A is a block diagram of a display device in accordance with the present disclosure.
Figure 1B:
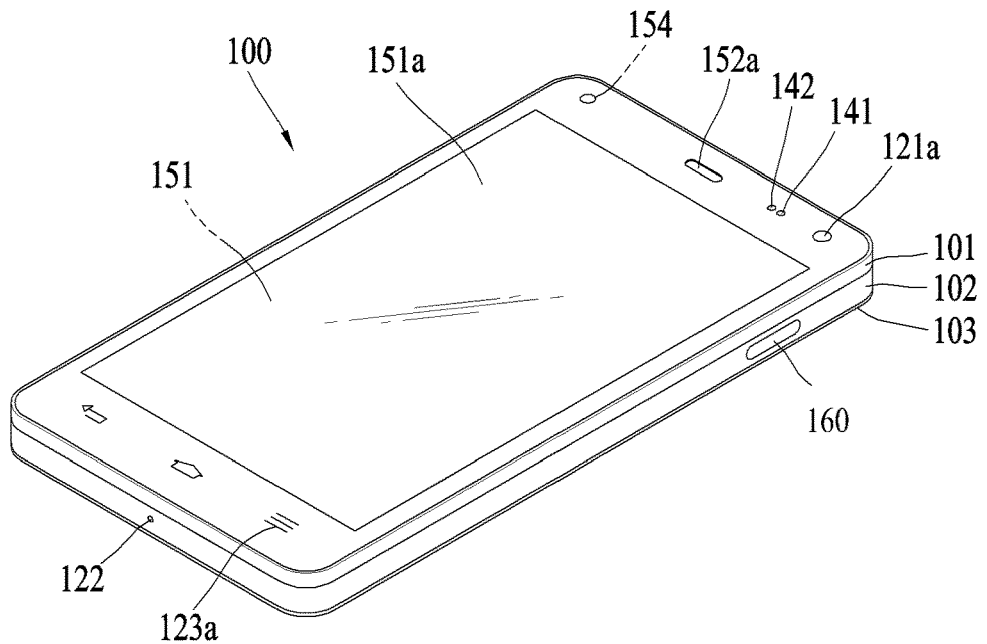
FIGS. 1B and 1C are conceptual views of one example of the display device, viewed from different directions.
Figure 1C:
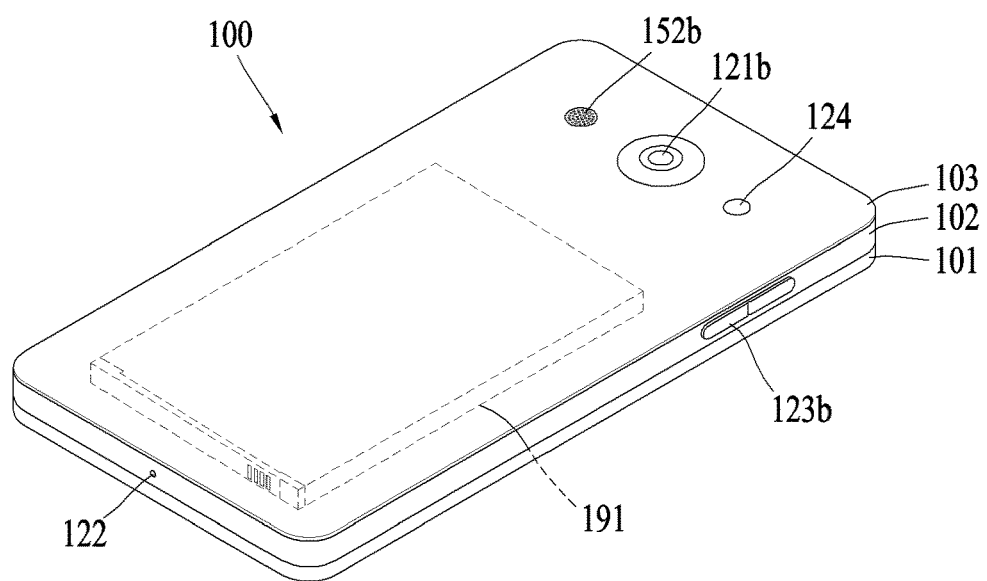

Reference is now made to FIGS. 1A-1C, where FIG. 1A is a block diagram of a display device in accordance with the present disclosure, and FIGS. 1B and 1C are conceptual views of one example of the display device, viewed from different directions.

The display device 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in The FIG. 1A is not a requirement, and that greater or fewer components may alternatively be implemented.

More specifically, the wireless communication unit 110 typically includes one or more modules which permit communications such as wireless communications between the display device 100 and a wireless communication system, communications between the display device 100 and another display device, communications between the display device 100 and an external server. Further, the wireless communication unit 110 typically includes one or more modules which connect the display device 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the display device, the surrounding environment of the display device, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The display device 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the display device 100 and a user, as well as function as the user input unit 123 which provides an input interface between the display device 100 and the user.

The interface unit 160 serves as an interface with various types of external devices that can be coupled to the display device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the display device 100 may perform assorted control functions associated with a connected external device, in response to the external device being connected to the interface unit 160.

The memory 170 is typically implemented to store data to support various functions or features of the display device 100. For instance, the memory 170 may be configured to store application programs executed in the display device 100, data or instructions for operations of the display device 100, and the like. Some of these application programs may be downloaded from an external server via wireless communication. Other application programs may be installed within the display device 100 at time of manufacturing or shipping, which is typically the case for basic functions of the display device 100 (for example, receiving a call, placing a call, receiving a message, sending a message, and the like). It is common for application programs to be stored in the memory 170, installed in the display device 100, and executed by the controller 180 to perform an operation (or function) for the display device 100.

The controller 180 typically functions to control overall operation of the display device 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the display device 100 to drive the application programs.

The power supply unit 190 can be configured to receive external power or provide internal power in order to supply appropriate power required for operating elements and components included in the display device 100. The power supply unit 190 may include a battery, and the battery may be configured to be embedded in the terminal body, or configured to be detachable from the terminal body.

Some or more of the components may be operated cooperatively to embody an operation, control or a control method of the display device in accordance with embodiments of the present disclosure. Also, the operation, control or control method of the display device may be realized on the display device by driving of one or more application problems stored in the memory 170.

Referring now to FIGS. 1B and 1C, the display device 100 is described with reference to a bar-type terminal body. However, the display device 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of display device (for example, bar-type, watch-type, glasses-type, and the like). However, such teachings with regard to a particular type of display device will generally apply to other types of display devices as well.

Here, the terminal body may be understood to refer to the concept of this bore a display device (100) to at least one of the aggregate.

The display device 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the display device 100 may be configured such that one case forms the inner space. In this example, a display device 100 having a uni-body is formed in such a manner that synthetic resin or metal extends from a side surface to a rear surface.

If desired, the display device 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The display device 100 may include the display unit 151, the audio output module, the proximity sensor 141, the illuminance sensor 142, the optical output module 154, the camera 121, the user input unit 123, the microphone 122 and the interface unit 160.

It will be described for the display device as shown in FIGS. 1B and 1C. The display unit 151, the first audio output module 151a, the proximity sensor 141, an illumination sensor 142, the optical output module 154, the first camera 121a and the first manipulation unit 123a are arranged in front surface of the terminal body, the second manipulation unit 123b, the microphone 122 and interface unit 160 are arranged in side surface of the terminal body, and the second audio output modules 152b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the display device 100. For example, the display unit 151 may display execution screen information of an application program executing at the display device 100 or user interface (UI) and graphic user interface (GUI) information in response to the execution screen information.

The display unit 151 outputs information processed in the display device 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the display device 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the display device 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the display device 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the display device 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the display device 100, but other locations are possible. If desired, multiple microphones may be implemented, with such an arrangement permitting the receiving of stereo sounds.

The interface unit 160 may serve as a path allowing the display device 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the display device 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown located adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A) may be retractable into the terminal body. Alternatively, an antenna may be formed using a film attached to an inner surface of the rear cover 103, or a case that includes a conductive material.

A power supply unit 190 for supplying power to the display device 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the display device 100 can also be provided on the display device 100. As one example of an accessory, a cover or pouch for covering or accommodating at least one surface of the display device 100 may be provided. The cover or pouch may cooperate with the display unit 151 to extend the function of the display device 100. Another example of the accessory is a touch pen for assisting or extending a touch input to a touch screen.

Recently, various sensors have been employed in relation to user authentication technology. Patterns of an iris, a fingerprint, a vein pattern, and the like are different from person to person, and thus users can be distinguished on the basis thereof to allow only registered users to access an electronic device. These patterns have no risk of being exposed to a third party unlike a conventional password or lock pattern, and may easily release the lock state. For these reasons, devices equipped with biometric identification technology are increasing.

The display device 100 including the display unit may also be equipped with the biometric technology, and the fingerprint recognition device can be mounted in a manner of the highest recognition rate among biometric techniques.

Conventionally, a fingerprint of a user has been recognized by employing a button or a separate fingerprint recognition unit. However, in recent years, the size of the display unit has become larger and buttons other than the display unit at the front part have been minimized Thus, it is difficult to secure a space for positioning the fingerprint recognition unit at the front part. In order to address this issue, a fingerprint sensor may be placed directly on the display unit.

Recently, display units have employed organic light emitting diodes, and thus may be used with a backlight unit omitted therefrom. In the organic light emitting diode display, an organic light emitting diode for emitting light is disposed on the back surface of the transparent polymer layer, and an electrode layer for controlling light emitted from the organic light emitting diode is disposed on the back.

If the backlight unit is omitted, a display unit that at least partially allows light to be transmitted therethrough may be implemented. In addition, by mounting a fingerprint sensor on the back surface of a display unit employing the organic light emitting diode, the fingerprint of a finger positioned on the front surface of the display unit may be recognized.

Figure 2:
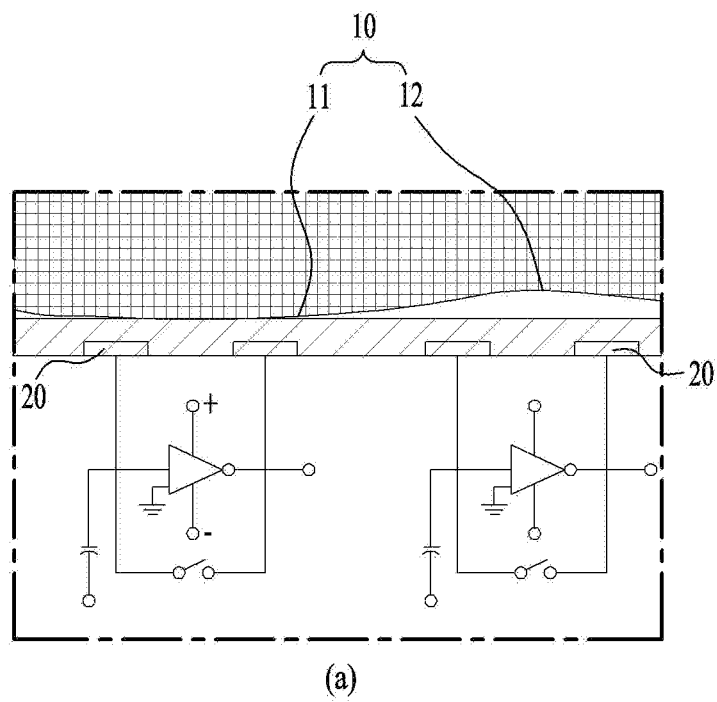
FIG. 2 shows a capacitive fingerprint sensor and an optical fingerprint sensor.
Figure 2:
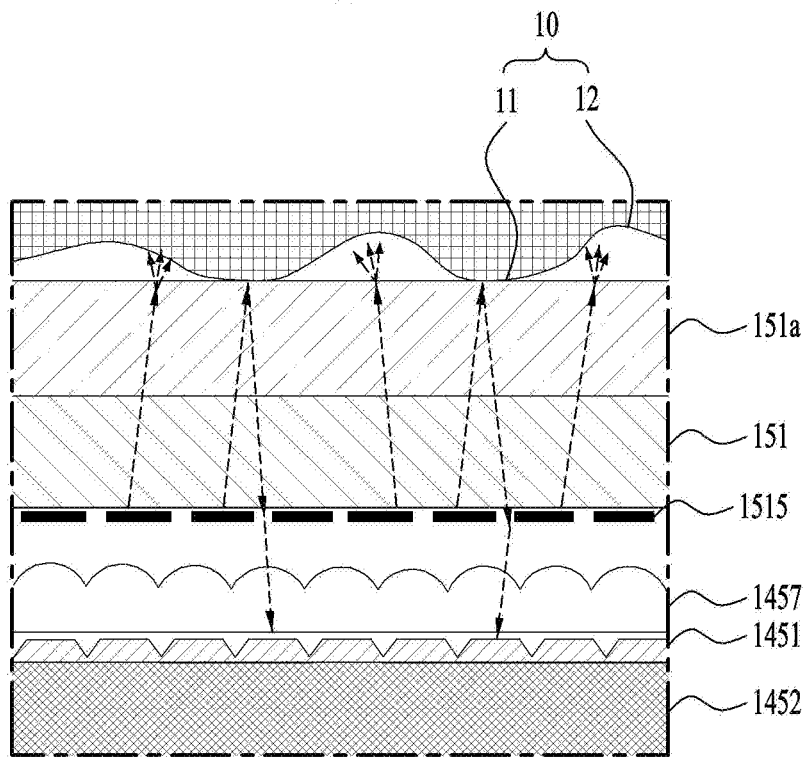

FIG. 2 shows the layered structure of the fingerprint sensor 145, wherein FIG. 2(a) shows a capacitive fingerprint sensor and FIG. 2(b) shows an optical fingerprint sensor. When touched by a finger 10 of a user, the capacitive fingerprint sensor may read the fingerprint shape using a conductor, based on a potential difference between a finger ridge 11 and a finger valley 12 of the fingerprint. When an independent fingerprint sensor is provided, the corresponding technique may be most easily implemented, and fingerprint sensors widely used until now are of the capacitive type.

However, while the capacitive fingerprint sensor requires a short distance between the conductor 20 and the fingerprint of the user, the thickness of the display unit 151 is greater than the distance required by the capacitive fingerprint sensor. Accordingly, the fingerprint may not be correctly recognized with the capacitive fingerprint sensor. Preferably, rather than the capacitive fingerprint sensor, an optical fingerprint sensor is employed because implementing a fingerprint sensor on the front surface of the display unit 151, that is, directly under the cover glass 151a is expensive and affects an image output from the display unit.

Optical sensors may be divided into infrared sensors and visible-light sensors. When infrared light is projected toward the finger 10 of the user, the light reaching the finger ridge 11 may be absorbed by the finger 10 of the user, while the light reaching the finger valley 12 may be reflected and thus be sensed by the optical sensor 1451.

In the case of the infrared sensor, since the organic light emitting diode of the display unit may be damaged by the infrared rays, a member for guiding light projected from an infrared light source so as to be emitted toward the front surface without directly reaching the organic light emitting diode should be separately provided on the front surface of the organic light emitting diode. When the member for guiding light is added, the thickness of the display part 151 is increased. When the member is omitted, the organic light emitting diode may be damaged. Thus, in the present disclosure, a visible-light fingerprint sensor configured to read a fingerprint using light emitted from the organic light emitting diode may be employed.

The organic light emitting diode display 151 is configured by arranging a plurality of organic light emitting diodes and electrodes in a lattice form on a transparent substrate, and light is allowed to pass through the gaps between the organic light emitting diodes. Thus, light emitted from the organic light emitting diodes may be reflected by the finger 10 of the user and reach even the optical sensor 1451 positioned on the back surface of the display unit 151.

Referring to FIG. 2(b), ridges and valleys of the fingerprint may be sensed using the light emitted from the organic light emitting diodes. The light emitted from the organic light emitting diodes may be reflected by the finger ridges 11 of the user's fingerprint and be sensed by the optical sensor 1451 and may be scattered on the finger valleys 12 and be sensed by the optical sensor 1451.

A base substrate 1452, on which the optical sensor 1451 is mounted, may be further provided on the back surface of the optical sensor 1451. In order to condense light reaching the optical sensor 1451 to increase the recognition rate, an optical layer 1457 may be further positioned on the front surface of the optical sensor 1451. The optical layer 1457 may include a plurality of microlenses.

The pitch of the microlenses may have a value which is 1/n times the corresponding value of the pixels of the optical sensor since it serves to collect light on each pixel of the optical sensor 1451. That is, one optical sensor may correspond to one microlens (the pitch between the microlenses is equal to the pitch between the optical sensor pixels) or four microlenses (the pitch between the microlenses is one-half the pitch between the optical sensor pixels).

Figure 3:
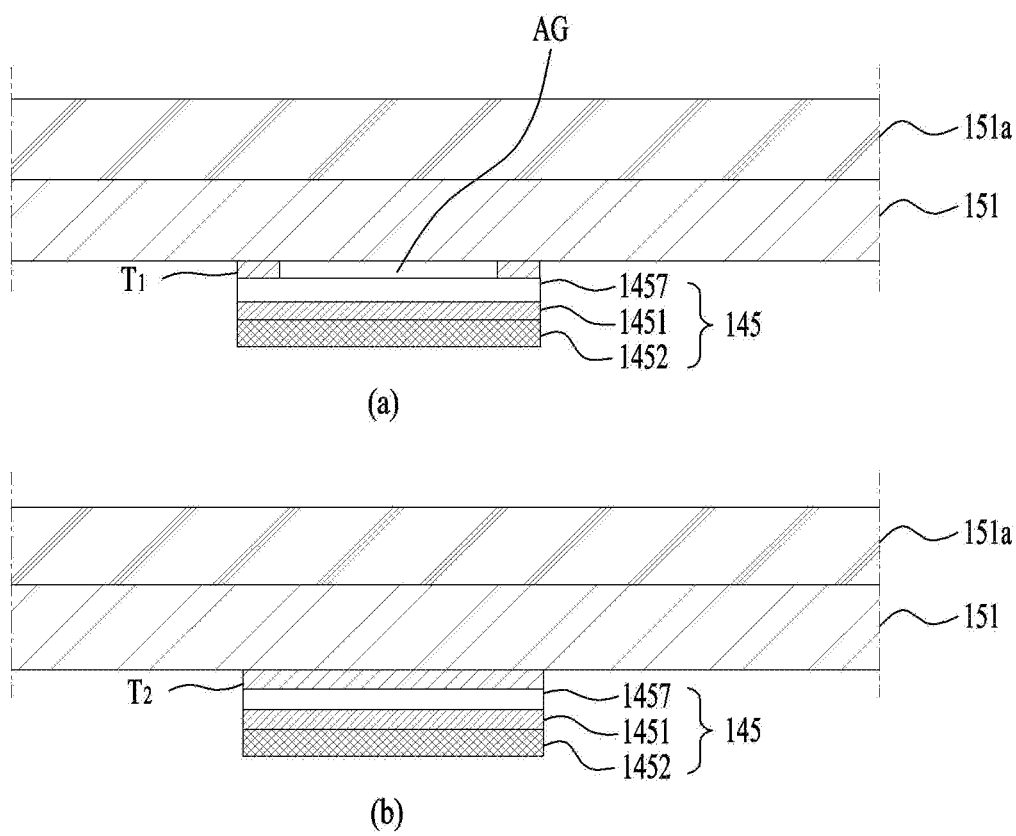
FIG. 3 is a view showing a fingerprint sensor positioned on the back surface of a conventional display unit.

FIG. 3 is a view showing a fingerprint sensor positioned on the back surface of a conventional display unit 151. The fingerprint sensor may include an optical sensor 1451 configured to sense a difference in light reflected depending on the ridges and valleys 11 and 12 of the fingerprint, an optical layer 1457 mounted on the front surface of the optical sensor 1451 to collect light incident on the optical sensor 1451, and a base substrate 1452 on which the optical sensor 1451 is seated.

FIG. 3(a) illustrates an embodiment in which a fingerprint sensor is attached to the back surface of the display unit 151 except an area which may receive light, using an adhesive tape T1 such as a double-sided adhesive tape (DAT). In the case of using the adhesive tape T1, pressure is applied to attaching the fingerprint sensor, and a position corresponding to a portion where the adhesive tape T1 of the display unit 151 is positioned is recessed, which produces a rippled pattern on the display unit 151.

In order to disperse the pressure, an adhesive tape having elasticity may be used or an elastic member may be provided. However, an air gap AG corresponding to the thickness of the adhesive tape is formed between the display unit 151 and the fingerprint sensor. Thus, when a user position the finger 10 on the fingerprint sensor and presses the fingerprint sensor for fingerprint recognition, fingerprint recognition may fail to be performed correctly due to a change in the thickness of the air gap.

Particularly, when the adhesive tape T1 is deformed and thus the positions are changed along the plane of the fingerprint sensor, the pixels of the display, the pixels of the fingerprint sensor and the pitches of the microlenses of the optical layer 1457 may be misaligned, and thus a wave pattern may be produced, which is called the Moiré effect. When the Moiré effect occurs, a rippled fingerprint image is obtained, and thus the fingerprint may not be correctly recognized.

As shown in FIG. 3(b), the optical sensor may be uniformly attached to the front surface of the fingerprint sensor using an adhesive tape T2 of a transparent material such as OCA (optically clear adhesive). In this case, although the air gap may be omitted, the recognition rate of the optical sensor 1451 may be deteriorated due to presence of the adhesive tape T2 on the front surface. In addition, when pressure is applied to perform attachment, the display unit 151 is depressed, which needs to be addressed.

Figure 4:
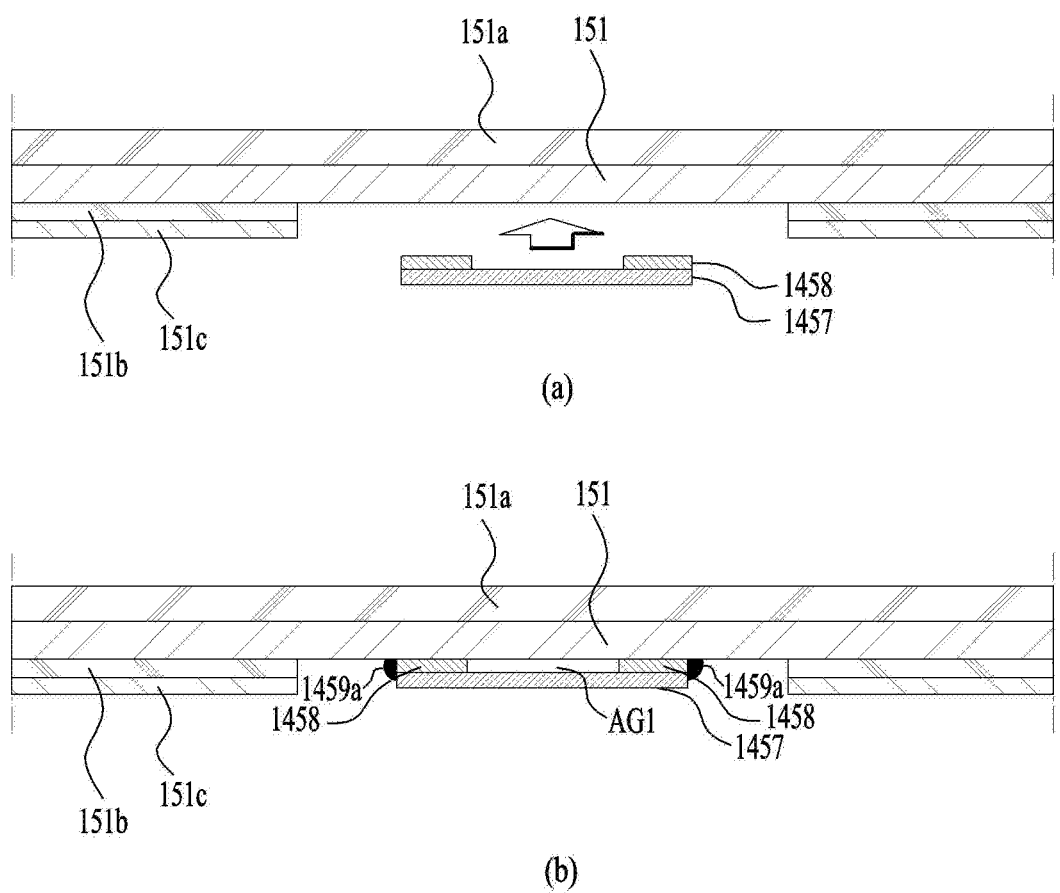
FIGS. 4 and 5 illustrate a method of bonding a fingerprint sensor to the display unit according to an embodiment of the present disclosure.
Figure 5:
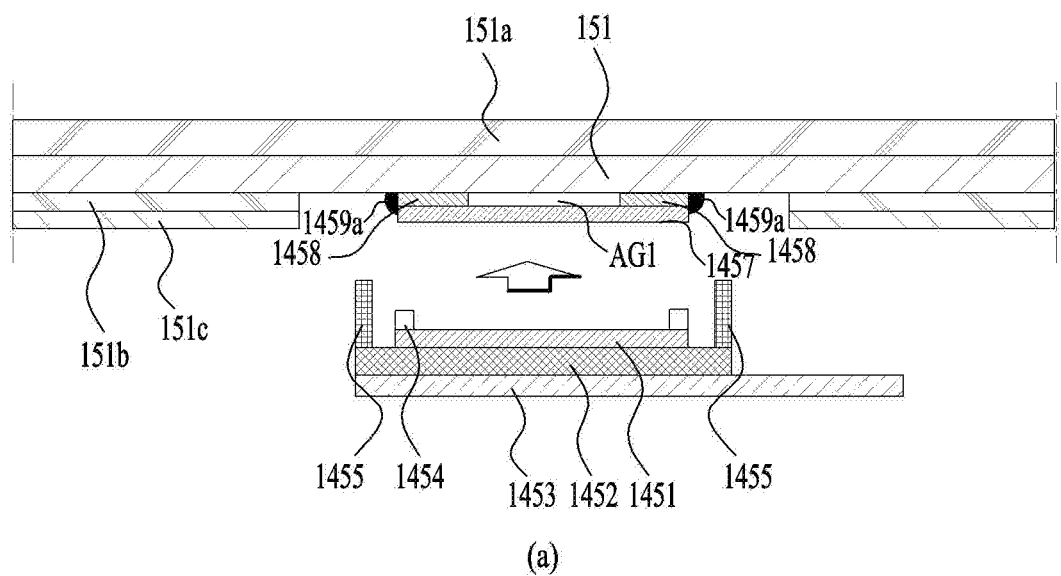
Figure 5:
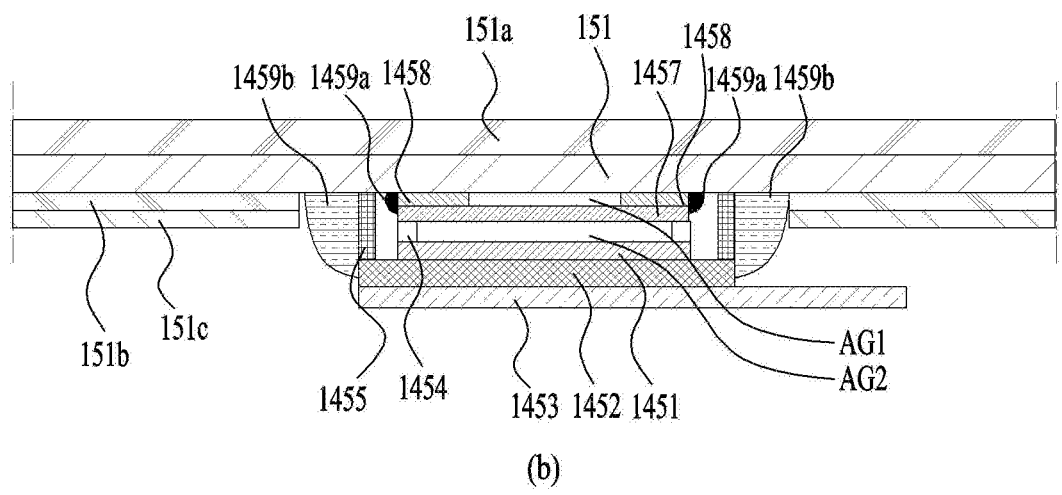

FIGS. 4 and 5 illustrate a method of bonding a fingerprint sensor to the display unit 151 according to an embodiment of the present disclosure. In order to address the above-mentioned issue in the present disclosure, a rigid member may be used in forming the air gap in order to prevent change in the thickness of the air gap, and a hardening technique rather than the pressing technique may be used to perform the attachment operation to prevent depression of the display unit 151 during the attachment operation.

The organic light emitting diode display may include, on the back surface thereof, a protective layer for protecting the organic light emitting elements and may include a cushion tape for attaching the protective layer 151b to the display unit 151. A metal layer 151c may be further formed on the back surface of the protective layer 151b to protect the display unit from EMI (Electro Magnetic Interference) applied to the display unit 151. Since the protective layer 151b and the metal layer 151c do not allow light to be transmitted therethrough, a fingerprint sensor may be attached by removing a part of the protective layer 151b and a metal layer 151c.

First, as shown in FIG. 4(a), the optical layer 1457 is attached to the back surface of the display unit 151. A first spacer 1458 for forming an air gap between the optical layer and the display unit 151 may be provided at the periphery of the front surface of the optical layer 1457. The first spacer 1458 may be disposed along the periphery of the optical layer 1457 and be formed of a rigid material to form a first air gap AG1 which is uniform. The first spacer 1458 and the optical layer 1457 may be pre-bonded using an adhesive or the like.

As shown in FIG. 4(b), a sealant 1459a may be used to bond the first spacer 1458 and the display unit 151. The sealant 1459a fixes the optical layer 1457 and the display unit 151. When the sealant is subjected to plastic working in the liquid state, it is hardened to fix the display unit 151 and the first spacer 1458 even without applying pressure. The plastic working may be performed through heat treatment or by leaving the coating material in the air. To more stably fix the optical layer and the display unit, the sealant 1459*a* may be applied so as to reach even the sides of the first spacer 1458, the display unit 151 and the optical layer 1457.

As shown in FIG. 5(*a*), the optical sensor 1451 may be attached to the back surface of the optical layer 1457. The optical sensor 1451 may further include a flexible substrate 1453 for transmitting information collected by the optical sensor 1451 to the main substrate may be further provided with the optical sensor 1451 seated on the base substrate 1452.

A structure formed by bonding the flexible substrate 1453, the base substrate 1452, and the optical sensor 1451 is disposed on the back surface of the optical layer 1457. A second spacer 1454 may be disposed at the periphery of the front surface of the optical sensor 1451 to form a second air gap AG2 between the optical layer 1457 and the optical sensor 1451. A second air gap AG2 corresponding to the height of the second spacer 1454 is formed between the optical layer 1457 and the optical sensor 1451. Since the Moiré effect becomes more severe as the distance between the respective layers is reduced, the second air gap AG2 may suppress the Moiré effect occurring between the pixels of the optical sensor 1451, the pitches of the microlenses and the pixels of the display unit 151.

The first air gap and the second air gap may have a thickness greater than or equal to 20 μm and less than or equal to 30 μm. If the thickness exceeds 30 μm, it is difficult for the reflected light to be transmitted to the optical sensor. If the thickness is less than 20 μm, the issue of the Moiré effect is not addressed.

Further, in order to maintain the gap between the display unit 151 and the optical sensor 1451, a third spacer 1455 may be positioned between the base substrate 1452 and the display unit 151. The third spacer 1455 may be formed of a rigid material, and a sealant 1459*b* may be used to bond the third spacer 1455 and the display unit 151. The sealant 1459*b* may be applied in the liquid state or paste state and hardened to bond the display unit 151 to the third spacer 1455 without applying pressure, as in the case of the sealant 1459*b* for bonding the first spacer 1458 and the display described above.

In the case where the third spacer 1455 is formed of a rigid material, the thickness of the second air gap AG2 may not change even if the second spacer 1454 is formed of a soft material. Thus, deterioration of the fingerprint recognition rate, which may occur when the thickness of the second air gap AG2 changes, may be prevented.

Figure 6:
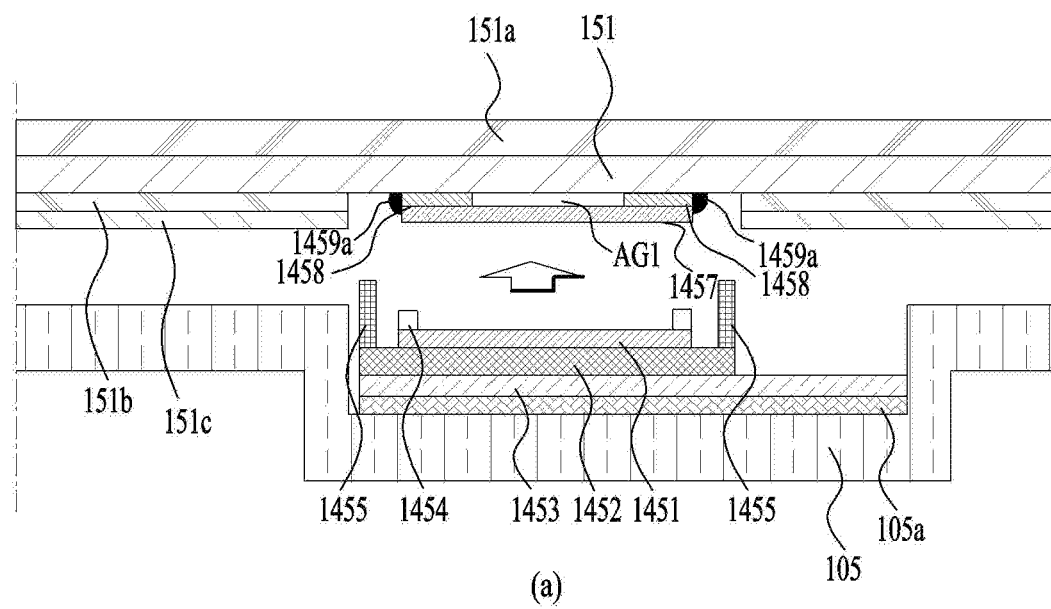
FIG. 6 illustrates a method of bonding a fingerprint sensor to the display unit according to another embodiment of the present disclosure.
Figure 6:
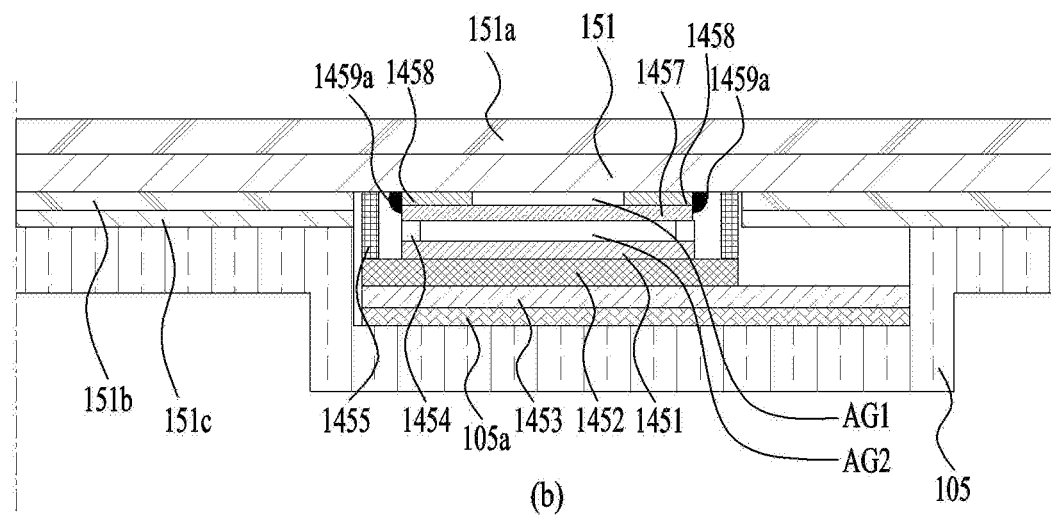

FIG. 6 illustrates a method of bonding a fingerprint sensor to the display unit 151 according to another embodiment of the present disclosure. This embodiment differs from the previous embodiment in attaching the structure including the optical sensor 1451, the base substrate 1452, and the flexible substrate 1453 after attaching the optical layer 1457.

In this embodiment, the structure may be fixed using a middle frame 105 supporting the back surface of the display unit 151. The middle frame 105 supports the back surface of the display unit 151, and a portion thereof where the fingerprint sensor is positioned may be recessed as shown in FIG. 6(*a*). The structure may be attached to the frame using an adhesive tape 105*a* and the display unit 151 may be seated on the middle frame 105 such that the optical layer 1457 and the optical sensor 1451 are stacked, forming the second air gap AG2, as shown in FIG. 6(*b*).

In this case, the sealant 1459*a*, 1459*b* for fixing the third spacer 1455 and the display unit 151 may be omitted, and thus ease of assembly is superior to that of the previous embodiment. However, the above-described embodiment may be more advantageous in terms of the performance of the fingerprint sensor 145 because the optical sensor 1451 is more securely bonded to the display unit 151.

According to at least one embodiment of the present disclosure, the issue of the depression effect may be prevented when the fingerprint sensor is mounted on the display unit. In addition, performance deterioration of the fingerprint recognition sensor may be prevented by preventing distortion of the air gap when the user presses the display unit using a finger. In addition, the Moiré effect caused by mismatch between the pitch of the microlenses and the pitch of the pixels of the optical sensor may be prevented.

While the present disclosure has been described with reference to exemplary embodiments, it is to be understood that the disclosure is not limited to the disclosed exemplary embodiments, but, on the contrary, is intended to cover various modifications and equivalent arrangements included within the spirit and scope of the appended claims. It will be appreciated that many variations and applications not illustrated are possible. For example, each component specifically shown in the embodiments can be modified and implemented. It is to be understood that the present disclosure is not limited to the above-described embodiments, and variations and modifications may be made without departing from the spirit and scope of the present disclosure as defined by the appended claims.

What is claimed is:

1. A display device comprising:
a display unit;
a cover glass configured to protect a front surface of the display unit;
an optical layer disposed on a back surface of the display unit;
a first spacer positioned between the optical layer and the display unit to form a first air gap between the display unit and the optical layer;
an optical sensor disposed on a back surface of the optical layer;
a second spacer positioned between the optical sensor and the optical layer to form a second air gap between the optical layer and the optical sensor;
a base substrate on which the optical sensor is mounted;
a first sealant applied in a paste state and changed into a solid state to bond the first spacer, the display unit and the optical layer;
a memory unit configured to store fingerprint information of a user;
a controller configured to determine whether information collected by the optical sensor matches the stored fingerprint information; and
a flexible substrate connecting the controller and the base substrate,
wherein the first spacer comprises a rigid material.

2. The display device according to claim 1, further comprising:
a third spacer positioned between an outer periphery of the base substrate and the back surface of the display unit.

3. The display device according to claim 2, further comprising:
a second sealant applied in the paste state and changed into the solid state to bond the third spacer, the base substrate and the display unit.

4. The display device according to claim 3, wherein the first sealant and the second sealant are subjected to plastic working in a liquid state or the paste state and changed into the solid state.

5. The display device according to claim 4, further comprising:
   a housing having a front surface on which the display unit is mounted;
   a middle frame positioned inside the housing and configured to support a back surface of the flexible substrate; and
   an adhesive tape interposed between the flexible substrate and the middle frame.

6. The display device according to claim 1, wherein the optical layer comprises a plurality of microlenses.

7. The display device according to claim 6, wherein a pitch between the plurality of microlenses is equal to 1/n times a pitch between pixels of the optical sensor, wherein n denotes an integer greater than 1.

8. The display device according to claim 1, wherein a thickness of the first air gap and a thickness of the second air gap are greater than or equal to 20 micrometers ($\mu m$) and less than or equal to 30 $\mu m$.

9. The display device according to claim 1, further comprising:
   a protective layer positioned on the back surface of the display unit, the protective layer having an opening corresponding to an area corresponding to the optical layer and the first sealant.

10. The display device according to claim 9, further comprising:
    a metal layer provided on a back surface of the protective layer, the metal layer having an opening corresponding to the opening of the protective layer.

11. The display device according to claim 1, wherein the display unit comprises:
    a transparent polymer layer;
    an organic light emitting diode (OLED) positioned on a back surface of the transparent polymer layer; and
    an electrode layer positioned on a back surface of the OLED.

* * * * *